April 12, 1966 J. E. RACY 3,246,266

ELECTRONICALLY TUNABLE CAVITY OSCILLATOR

Filed March 20, 1964

INVENTOR
JOSEPH E. RACY
BY

United States Patent Office 3,246,266

Patented Apr. 12, 1966

3,246,266

ELECTRONICALLY TUNABLE CAVITY OSCILLATOR

Josept E. Racy, Nashua, N.H., assignor to Sanders Associates, Inc., Nashua, N.H., a corporation of Delaware Filed Mar. 20, 1964, Ser. No. 353,425
11 Claims. (Cl. 333—83)

Figure 1:
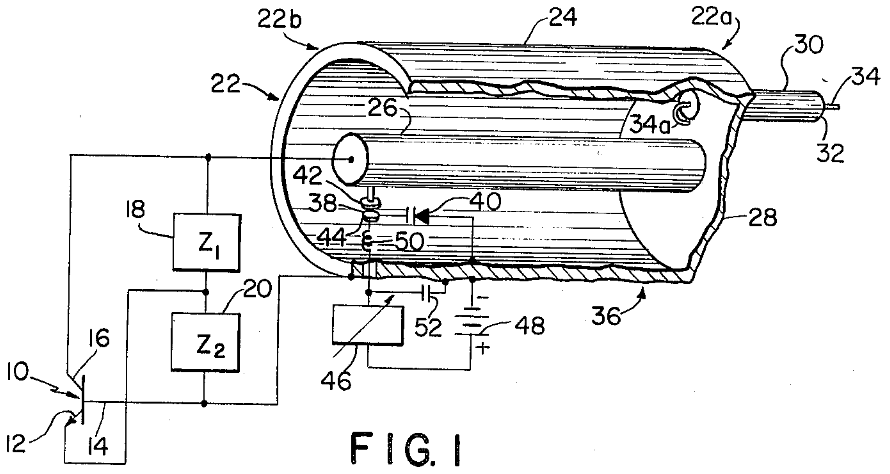

This invention relates to electronic tuning of a distributed parameter resonant circuit. More specifically, it provides a high performance tuning mechanism for a resonant cavity. The tuning mechanism can be operated to modulate the resonant frequency of the cavity, and to continuously adjust its unmodulated resonant frequency.

The invention also concerns a cavity oscillator incorporating the tuning mechanism.

It is well known that the resonant frequency of a cavity can be changed by changing the cavity capacitance relative to the inductance. This is conventionally achieved by changing the physical dimensions of the cavity. Recently, electronically tunable cavities have also become known in the radio frequency art. The tuning elements for such cavities conventionally utilize voltage-controllable capacitance devices. For example, a reverse-biased semiconductor junction has a capacitance that varies with voltage. A device termed a "varactor" is constructed on this basis. Another form of variable capacitance device known in the art is a capacitor having a ferro-electric dielectric material.

One purpose of tuning a resonant cavity is to make it possible for cavities having the same size to be resonant at different frequencies, thereby avoiding the expense of fabricating a different cavity for each resonant frequency. A cavity may also be tuned to correct its resonant frequency with a feedback error signal. For example, a change in the resonant frequency caused by a change in ambient temperature can be corrected by applying a correction signal to the tuning mechanism of the cavity.

Another reason for tuning a cavity is to modulate its resonant frequency. A cavity having the latter feature can advantageously be used to construct a frequency modulated oscillator.

It is an object of the present invention to provide an improved tuning mechanism for operation with a distributed parameter resonant circuit.

It is also an object of the invention to provide a resonant cavity having electronic tuning characterized by reliable operation.

Another object of the invention is to provide an electronic cavity-tuning mechanism capable of rapidly changing the resonant frequency of the cavity.

A further object of the invention is to provide an electronic tuning mechanism capable of producing a large change in the resonant frequency of a cavity.

It is also an object of the invention to provide a resonant cavity having electronic tuning of the above character and whose resonant frequency in the absence of an electrical tuning signal can be readily adjusted to a fairly precise frequency value.

Another object of the invention is to provide an improved tuning mechanism for both electronically and mechanically tuning a resonant cavity.

A further object is to provide a cavity-tuning construction of the above character that withstands mechanical shock and vibration.

The invention is also directed to an oscillator incorporating a cavity employing a tuning mechanism having the above features.

Other objects of the invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

Figure 2:
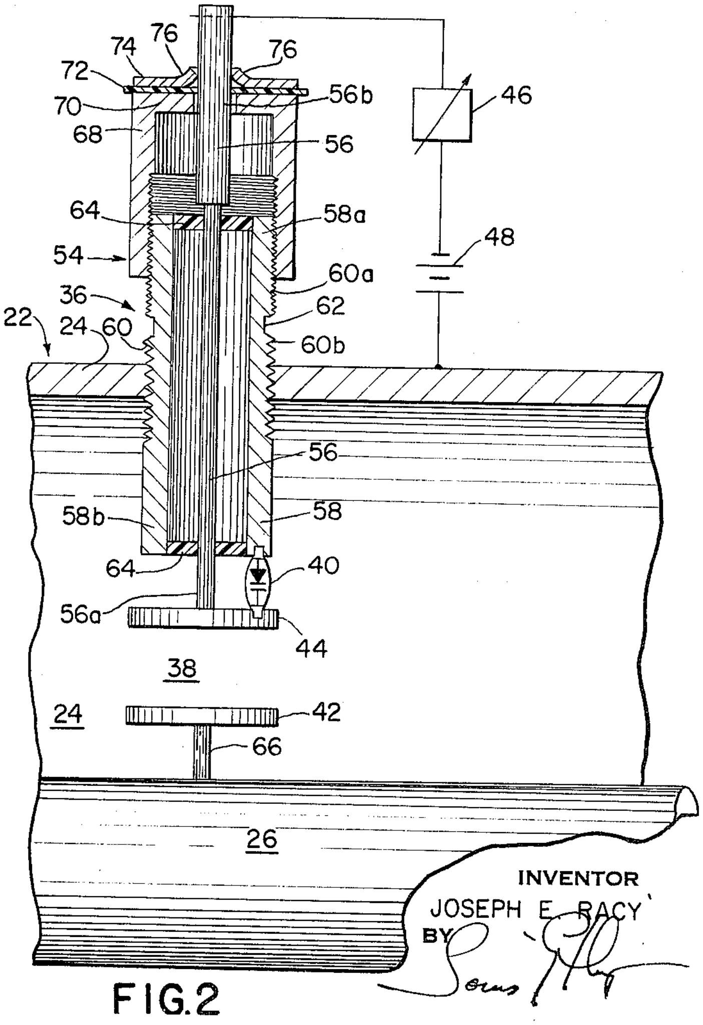

For a fuller understanding of the nature and objects of the invention, reference should be had to the following detailed description taken in connection with the accompanying drawings, in which:

FIG. 1 is a partly schematic representation of an electronically tunable oscillator embodying the invention; and FIG. 2 is an enlarged fragmentary view of a tunable cavity embodying the invention.

A cavity tuning circuit embodying the invention has a voltage-controllable capacitance device in series with a high-Q, i.e. low loss, capacitor. The high-Q capacitor is adjustable for initial control of the resonant frequency and an external signal source is connected with the capacitance device for continuous and fine tuning of the cavity. Thus, the external signal source can correct deviations in the resonant frequency of the cavity and also can frequency modulate it.

The controllable capacitance device and a portion of the high-Q capacitor are supported within the cavity by means of a length of transmission line. This line is arranged as a resonant stub connecting the tuning signal source to the capacitance device while isolating the radio frequency energy in the cavity from the signal source.

With this arrangement, which will now be described in detail, the tuning circuit has a high-Q and thus does not materially lower the Q of the cavity.

The construction of the tuning mechanism provides ready and relatively precise adjustment of the high-Q capacitor to tune the cavity. Moreover, it firmly supports the tuning elements within the cavity to resist movement under mechanical stress.

More specifically, FIG. 1 shows a three-reactance tunable oscillator embodying the invention. The oscillator conventionally includes a high-frequency transistor indicated generally at 10 and having an emitter 12, a base 14 and a collector 16.

A reactance element 18, having an impedance $Z_1$, is connected between the collector 16 and the emitter 12. A second reactance element 20, having an impedance $Z_2$, is connected between the emitter and the base 14.

The third reactance element of the oscillator is a tunable cavity indicated generally at 22 and connected between the collector 16 and base 14.

The three-reactance oscillator is a well-known device, examples of which are the Hartley and Colpitts circuits. Circuits of this type are described, for example, at pages 107 through 111 of Department of the Army Technical Manual TM 11–673 (June 1953). The Colpitts circuit is preferred with the present invention, and in this case $Z_1$ and $Z_2$ represent capacitive reactances, generally the collector-emitter and base-emitter capacitances of the transistor 10. The frequency of oscillation is controlled by changing the resonant frequency of the cavity 22, and the output signal is coupled from the oscillator by a probe 30 shown at the right end of the cavity.

As also shown in FIG. 1, the illustrated tunable cavity 22 is constructed with a coaxial transmission line outer conductor 24 and an inner conductor 26. A conductive end wall 28 forms a short circuit between inner and outer conductors at the cavity end *22a*. The inner and outer conductors extend from the cavity wall 28 to the cavity end *22b* for a length equivalent to approximately a quarter-wavelength at a central design frequency $f_o$. With this construction, which is conventional, the cavity 22 is resonant at the frequency $f_o$ and develops a high impedance between the inner and outer conductors at its end *22b*.

The probe 30 comprises an outer conductor 32 connected to the cavity end wall 28 and an inner conductor 34 passing through the end wall 28. The inner conductor 34 protrudes into the cavity with a loop 34a connected at its end to the wall 28.

FIG. 1 also shows, in schematic form, a tuning mechanism indicated generally at 36 and comprising a mechanically adjustable high-Q capacitor 38 in series with an electronically variable capacitance provided by a reverse-biased varactor 40. The series combination of the capacitor 38 and varactor 40 is between the inner conductor 26 and the outer conductor 24 adjacent the open circuit end 22b where the electric field in the cavity is strongest.

The high-Q capacitor 38 comprises on one side, plate 42 connected to the inner conductor 26. Opposite the plate 42 is a plate 44 movable relative to the plate 42, preferably with the construction described hereinafter with reference to FIG. 2. The plates 42 and 44 are spaced apart in the radial direction, which is substantially parallel to the electric field in the cavity 22 in the region where the tuning mechanism is located. Inasmuch as air is the dielectric for the capacitor 38, it has a high-Q; that is, the electrical resistance of the air between the plates 42 and 44 is extremely high.

With this construction of the capacitor 38, when the plate 44 is moved radially inward toward the plate 42, the capacitance between them increases. This lowers the resonant frequency of the cavity 22, i.e. the cavity resonates at a longer wavelength.

The varactor 40 is connected between the capacitor plate 44 and the cavity outer conductor 24. An external source 46 of a frequency control signal and a bias supply 48 are connected between the outer conductor 24 and the capacitor plate 44 and thus in series with the varactor 40. The polarity of the bias supply 48, shown as a battery, is such as to reverse bias the varactor. The voltage of the source 46 is less than the supply voltage of the battery and hence varies the reverse bias of the varactor about the point determined by the battery voltage. With this arrangement, the varactor 40 has a capacitive reactance that varies according to the voltage of the source 46 about a central value determined by the battery voltage.

The net voltage the source and battery develop across the varactor 40 determines the instantaneous resonant frequency of the cavity 22. Accordingly, the varactor 40 can provide fine tuning for the cavity. Where desired, the source 46 can have an alternating component so that the varactor operates to frequency modulate the oscillator.

With further reference to FIG. 1, the battery 48 and source 46 are connected to the capacitor plate 42 with a construction that may be represented electrically as a series inductor 50 and a bypass capacitor 52. The combination of these elements 50 and 52 applies the battery voltage and the voltage of the source 46 to the varactor, while presenting an impedance to the radio frequency energy in the cavity which is large compared to the impedance of the varactor.

As noted above, the capacitor 38 has a high-Q, designated $Q_1$. The Q of the varactor, $Q_2$, is generally less than $Q_1$. In fact, with many varactors, particularly those having a low cut-off frequency, $Q_2$ is quite low compared to $Q_1$. If the varactor 40 were connected directly between the inner and outer conductors 26 and 24, its low Q would result in a low Q for the entire cavity.

However, with the illustrated tuning mechanism 36, wherein the low-Q varactor is in series with the high-Q capacitor 38, the series combination of varactor and capacitor has a relatively high Q, commensurate with the high Q of the capacitor 38. One result of this high net Q is that the tuning mechanism 36 may utilize a varactor having a relatively low cut-off frequency and still present a high overall Q to the cavity 22.

Turning now to FIG. 2, the tuning mechanism 36 is constructed with a coaxial transmission line 54 having an inner conductor 56 and an outer conductor section 58 threaded to the cavity outer conductor 24. The inner conductor 56 supports the capacitor plate 44 and the varactor 40 is mounted between the plate 44 and the outer conductor section 58.

More specifically, the coaxial outer conductor section 58 has a thread 60 on its outer surface extending from its end 58a outside the cavity to beyond its connection with the cavity outer conductor 24. Preferably two threads are provided, a relatively fine thread 60a adjacent and end 58a and a somewhat coarser thread 60b where the section 58 engages the outer conductor 24. The conductor section 58 extends within the cavity in the radial direction for a length readily adjusted by turning it into or out of cavity outer conductor. In the event the cavity outer conductor 24 is thin, a collar (not shown) can be affixed thereto to engage a greater length of the conductor section 58 and ensure rigid support thereof. Such a collar may conventionally have means for locking the outer conductor section 58 in place, i.e. to prevent it from being accidentally turned.

The outer conductor section 58 preferably has a surface 62, intermediate the threads 60a and 60b and flattened to accommodate a wrench to facilitate adjustment. Alternatively, the surface 62 can be in the form of an enlarged disk (not shown) radially extending from the conductor section 58 and having a knurled surface to facilitate hand gripping.

The electrical length of the outer conduction section between its ends 58a and 58b is less than a quarter-wavelength at the lowest frequency at which the cavity 22 is to resonate.

As also shown in FIG. 2, dielectric beads 64 support the inner conductor 56 coaxially within the outer conductor 58. Conventional adhesives can be used between the beads 64 and the inner conductor 56 the conductor section 58 to prevent the inner conductor from moving axially with respect to the section 58.

The inner end 56a of the inner conductor extends beyond the end 58b of the outer conductor section and is joined to the center of the capacitor plate 44, which preferably is in the form of an annular disk as shown. A conductive stem 66 supports the other plate 42 of the capacitor 38 on the cavity inner conductor 26 aligned with the plate 44.

As noted above, the varactor 40 is mounted within the cavity 22 between the capacitor plate 44 and the end 58b of the outer conductor section 58. The bias and control signal are applied to the varactor by connecting the control signal source 46 and the battery 48 in series between the cavity outer conductor 24 and the transmission line inner conductor 56.

To prevent the inner conductor 56 from presenting a low impedance and thus shunting the varactor 40 and absorbing energy from the cavity, the transmission line 54 includes an outer conductor section 68 in series with the section 58 at its end 58a and connected to the inner conductor 56 at a distance therealong a quarter-wavelength from the end 58b of the outer conductor section 58. This short circuit connection reflects a substantially open circuit to the end 58b.

More particularly, the outer conductor section 68 has an open end fitting over the section 58 and engaging the thread 60a. A centrally-apertured end flange 70 covers the other end of the conductor section 68. The outer conductor sections 58 and 68 have a combined length between the flange 70 and the inner end 58b adjustable between a quarter-wavelength at the highest frequency at which the cavity 22 is to resonate and a quarter-wavelength at the lowest resonant frequency. The inner conductor 56 is sufficiently long to extend beyond the flange 70 at all positions of the section 68. An insulator 72, suitably mica, separates a short-circuiting disk 74 from the flange 70 and thereby provides a bypass capacitor between the flange and the disk. The disk and the insulator 72 can be secured to the end flange with a high quality adhesive.

The disk 74, which has a central aperture accommodating the inner conductor 56, is formed with spring fingers 76 slidably engaging the inner conductor. With this construction, the fingers 76 maintain secure electrical contact between the inner conductor and the disk. At the radio frequencies at which the cavity 22 is resonant, the capacitance between the disk 74 and the end flange 70 serves as the short circuit between the inner conductor 56 and the outer conductor of the transmission line 54. The high impedance which the radio frequency short circuit between the inner conductor 56 and the outer conductor section 68 reflect at the inner end of the transmission line 54 also isolates the tuning mechanism 36 from radio frequency disturbances coupled to portion of the inner conducting 56 outside the line 54.

At the lower frequency of the source 46, this capacitance has a high impedance.

The portion of the inner conductor 56 within the outer conductor section 68 appropriately has a larger diameter than the portion within the narrower outer conductor section 58. This maintains a relatively uniform impedance throughout the length of the transmission line 54 and thus minimizes reflections within the transmission line.

When the outer conductor section 58 is threaded with respect to the cavity 22, the resonant frequency changes at a rate determined in part by the size of the capacitor plates 42 and 44 and by the pitch of the thread 60*b*. After the cavity 22 is initially tuned in this manner, the outer conductor section 68 is threaded with respect to the section 58 to maximize the impedance between the outer conductor end 58*b* and the inner conductor 56. For example, when the cavity resonant frequency has been decreasing by moving the plate 44 closer to the plate 42, the outer conductor section 68 has to be turned outwardly to lengthen the inner conductor portion between the outer conductor end 58*b* and the short-circuiting fingers 76.

As noted above, the thread 60*b* is prefereably coarser than the thread 60*a*. Also, the threads are preferably cut in opposite directions. With this construction, the threads 60*a* and 60*b* may be so selected that when the section 58 is turned with respect to both the outer conductor section 68 and the cavity 22, the cavity resonant frequency and the frequency at which the transmission line 54 presents maximum impedance change at the same rate. As a result, the transmission line 54 is automatically tuned to the optimum length as the capacitor 38 is adjusted.

Although the capacitor 38 is illustrated in FIGS. 1 and 2 as comprising two plates 42 and 44, it can alternatively be constructed without the plate 42. That is, is can use the cavity inner conductor 26 in place of the plate 42. Moreover, although the cavity 22 is illustrated as having conventional coaxial construction, it is illustrative of distributed parameter resonant circuits in general, including strip transmission line resonators. It will also be apparent that a tuning mechanism embodying the invention can be utilized in other oscillators employing such resonant circuits.

The tuning mechanism of FIG. 2 exhibits high reliability and ruggedness. The resonant frequency of the cavity in which it is mounted can readily be electronically varied by 50 megacycles about a frequency of 1000 megacycles.

It will thus be seen that the objects set forth above, among those made apparent from the preceding description, are efficiently attained and, since certain changes may be made in carrying out the above method without departing from the scope of the invention, it is intended that all matter contained in the above description shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described the invention, what is claimed as new and secured by Letters Patent is:

1. A radio frequency tuning mechanism comprising in combination
(A) conductive means forming a capacitor plate,
(B) a quarter-wavelength transmission line having
(1) an inner conductor having first and second ends and connected at said first end to said capacitor plate, and
(2) an outer conductor having first and second ends,
(a) said second inner conductor end being adjacent said second outer conductor end, and
(b) said first inner conductor end extending beyond said outer conductor at said first end thereof so that said capacitor plate is spaced outwardly from said first end of said outer conductor,
(C) means forming a radio frequency impedance between said second ends of said conductors, said radio frequency impedance being small compared with the characteristic impedance of said transmission line, and
(D) a variable radio frequency capacitance device connected between said capacitor plate and said outer conductor at said second end thereof.

2. The tuning mechanism defined in claim 1 in which at frequencies below radio frequencies said impedance means has a high impedance relative to the characteristic impedance of said transmission line.

3. The tuning mechanism defined in claim 1 in which
(A) said transmission line outer conductor comprises first and second axially telescoping sections arranged in series with each other,
(1) said first section forming said first end of said outer conductor and fixedly supporting said inner conductor,
(2) said second outer conductor section carrying said radio frequency impedance means, and
(B) said radio frequency impedance means is connected to said inner conductor for movement along it,
(C) whereby the electrical length of said transmission line between said ends of said outer conductor is adjustable by varying the degree of telescoping of said outer conductor sections.

4. A tuning mechanism for a distributed parameter resonant circuit, said tuning mechanism comprising in combination
(A) conductive means forming a capacitor plate,
(B) a coaxial transmission line including
(1) an inner conductor having first and second ends,
(2) means supporting said capacitor plate from said first end of said inner conductor,
(3) a first outer conductor section having first and second ends and a first thread on a portion of its outer surface spaced from said second end thereof,
(4) insulating means supporting said inner conductor coaxially within said first outer conductor section with said first end of said inner conductor extending beyond said outer conductor section at said first end thereof so that said capacitor plate means is spaced outwardly from said outer conductor section,
(5) a second outer conductor section telescopically engaging said first section at said second end thereof and axially extending from said second end of said first outer conductor section,
(6) a conductive flange extending radially from said second outer conductor section at the end thereof remote from said first section,
(C) contact means slidably contacting said inner conductor where it passes said radial flange and having a capacitor portion extending closely spaced from said flange, (D) means insulating said contact means from said flange so that said contact means and said insulating means form a capacitor whose radio frequency impedance is low relative to the characteristic impedance of said transmission line, and (E) a voltage controllable capacitor device mounted and connected between said capacitor plate and said first outer conductor section at said first end thereof.

5. The tuning mechanism defined in claim 4 in which said first and second outer conductor sections are threaded together so that changing the threaded engagement between said sections changes the first length of said transmission line between said contact means and said first end of said outer conductor section.

6. The tuning mechanism defined in claim 5 in which asid first outer conductor section has a second thread on its outer surface adjacent said second end thereof and engaging said second outer conductor section, said second thread having the opposite sense from said first thread.

7. A tunable distributed parameter resonant circuit comprising in combination (A) a transmission device
  (1) having first and second spaced conductive sections,
  (2) possessing a resonant frequency at which the energy therein has an electric field component between said conductive sections, (B) a first transmission line inner conductor
  (1) extending from said second conductive section toward said first conductive section in a direction substantially parallel to said electric field,
  (2) having a first end intermediate said first and second conductive sections, and
  (3) having a second end further from said first conductive section than said first end thereof, (C) a capacitor plate connected to said inner conductor at said first end thereof and capacitively coupled with said first conductive section, (D) a first transmission line outer conductor for said inner conductor, said outer conductor
  (1) being connected to said second conductive section,
  (2) extending from said second section toward said first section, and
  (3) having an inner end spaced from said first conductive section by a distance greater than the spacing of said first end of said inner conductor from said first section, (E) a voltage controllable capacitance device supported between said capacitor plate and said inner end of said outer conductor, whereby said capacitance device and the capacitance between said capacitor plate and said first conductive section are in series between said first and second conductive section, and (F) a capacitor connected between said inner and outer conductors and disposed a quarter-wavelength from said inner end of said outer conductor at said resonant frequency, said capacitor having an impedance at said frequency which is negligible compared to the characteristic impedance of said inner and outer conductors.

8. The tunable circuit defined in claim 7 in which said transmission device is a transmission line having an inner conductor which is said first conductive section and an outer conductor which is said second conductive section.

9. The tunable circuit defined in claim 8 in which said first outer conductor supports said first inner conductor and is movable with respect to said outer conductor of said transmission device to vary the spacing between said capacitor plate and said inner conductor of said transmission device.

10. A tunable coaxial cavity comprising in combination (A) a cavity outer conductor, (B) a cavity inner conductor coaxial with said cavity outer conductor, (C) short circuit means connecting said cavity inner and outer conductors together to reflect a high impedance between said cavity conductors to a high impedance region spaced from said conductive means by substantially a quarter-wavelength at a central operating frequency intermediate a lower operating frequency and an upper operating frequency, (D) first conductive means forming a first capacitance plate on said cavity inner conductor in said high impedance region, (E) a first tuner outer conductor section
  (1) passing through said cavity outer conductor, and radially oriented with respect to said cavity,
  (2) having a first threaded portion connecting it to said cavity outer conductor,
  (3) having an inner end extending from said cavity outer conductor toward said first conductive means,
  (4) having a second threaded portion on its outer surface adjacent its end remote from said inner end, and
  (5) being less than a quarter-wavelength long at said lower operating frequency, (F) a second tuner outer conductor section
  (1) threadedly engaging said second threaded portion of said outer conductor section and axially extending from said first section at said remote end thereof,
  (2) being threadable with respect to said first section to extend from said inner end of said first section for a distance substantially ranging from a quarter-wavelength at said lower frequency to a quarter-wavelength at said upper frequency, (G) a tuner inner conductor
  (1) coaxially supported within said first outer conductor section for movement therewith,
  (2) having an inner end protruding toward said first conductive means beyond said inner end of first outer conductor section,
  (3) having an outer end extending beyond said second outer conductor section, (H) a second capacitive plate on the inner end of said tuner inner conductor aligned with said first conductive means, (I) a varactor mounted between and connected to said second capacitive plate and said inner end of said first outer conductor section, (J) a conductive flange protruding radially inward from said second outer conductor section at its end remote from said first section and having a hole through which said second inner conductor passes, (K) a dielectric disk on a surface of said flange, and (L) a conductive disk having a hole through which said inner conductor passes and secured on said insulated dielectric disk,
  (1) said conductive disk having resilient contacting fingers slidably engaging said inner conductor.

11. The tunable cavity defined in claim 10 in which said first threaded portion and said second threaded portion have opposite thread senses and having a pitch ratio such that when said first outer conductor section is turned with respect to both said cavity outer conductor and said second outer conductor section, the combined length of said first and second outer-conductor sections changes at the same rate as the resonant frequency of said cavity.

References Cited by the Applicant

UNITED STATES PATENTS

| | | |
|---|---|---|
| 2,182,377 | 12/1939 | Guanella. |
| 2,936,428 | 5/1960 | Schweitzer. |

| | | |
|---|---|---|
| 3,056,127 | 9/1962 | Harris. |
| 3,067,394 | 12/1962 | Zimmerman et al. |
| 3,094,672 | 6/1963 | Lewis et al. |
| 3,162,824 | 12/1964 | Herzog. |
| 3,169,226 | 2/1965 | Closson. |
| 3,204,198 | 8/1965 | Bachnick. |

HERMAN KARL SAALBACH, *Primary Examiner.*

UNITED STATES PATENT OFFICE
CERTIFICATE OF CORRECTION

Patent No. 3,246,266 April 12, 1966

Joseph E. Racy

It is hereby certified that error appears in the above numbered patent requiring correction and that the said Letters Patent should read as corrected below.

Column 4, line 34, after "conductor 56" insert -- and --; column 5, lines 31 and 32, for "decreasing" read -- decreased --; line 36, for "prefereably" read -- preferably --; column 6, line 25, for "second" read -- first --; column 7, line 19, for "asid" read -- said --; column 8, line 11, for "conductive" read -- short circuit --.

Signed and sealed this 11th day of March 1969.

(SEAL)
Attest:

Edward M. Fletcher, Jr.
Attesting Officer

EDWARD J. BRENNER
Commissioner of Patents